OSCILLATOR CONTROLLED SWITCHING CIRCUIT

Filed Feb. 7, 1966 3 Sheets-Sheet 1

United States Patent Office 3,461,316
Patented Aug. 12, 1969

3,461,316

OSCILLATOR CONTROLLED SWITCHING CIRCUIT

John R. Acton, Farmborough, and Peter Turton, Bugbrooke, near Northampton, England, assignors to The Plessey Company Limited, Ilford, England, a British company Filed Feb. 7, 1966, Ser. No. 525,724
Int. Cl. H03k *17/56*
U.S. Cl. 307—241 5 Claims

ABSTRACT OF THE DISCLOSURE

An oscillator input circuit connected over two paths each containing a capacitor to an output device including a solid-state amplifying device controlled by means including a rectifier, responsive to the energy received from the oscillator to bring about variation of its electrical condition for switching of said amplifying device.

This invention relates to electric switching arrangements.

In switching arrangements requiring a high degree of electrical isolation between input and output circuits of the arrangement transistors may not be suitable for use as switching devices due to insufficient impedance between the base (input) and emitter/collector (output) circuits when the transistors are cut-off. Switching arrangements which meet such electrical isolation requirements may comprise an electrically energisable light source connected in the input circuit and photo-conductive means having high dark resistance and low illuminated resistance connected in the output circuit arranged to be exposed to light from said light source. Alternatively, the input circuit may include electric heating means located in good heat-exchange relationship with thermo-resistive means connected in the output circuit of the arrangement so that the thermo-resistive means when unheated has a high resistance which falls when the thermo-resistive means is heated. With these switching arrangements it is difficult to achieve sufficiently high ON/OFF resistance ratios and/or a sufficiently low "ON" resistance value.

The present invention seeks to alleviate these difficulties by providing an electric switching arrangement comprising an input circuit including means for producing energy responsively to the passage of electric current through it and an output circuit including a solid state amplifying device, such as a bipolar transistor, a control circuit of which includes means comprising an element responsive to the said energy to bring about variation of its electrical condition for switching purposes and said means being so connected as to provide the requisite output circuit impedance. The energy responsive element may for example be a resistor whose value is changed by the said energy.

In the case of a transistor being used as the solid state amplifying device it is known that the emitter collector impedance of the transistor is very large when its base is connected via a low resistance to the emitter. Consequently, it may be arranged in accordance with this invention that the resistive means whose resistance changes in response to received energy is connected between the base and collector of the transistor and in the de-energised condition has a high resistance compared with a base/emitter resistor. Thus the impedance of the output circuit of the switching arrangement in the cut-off condition of the transistor is very high. The resistance of the resistive means when the latter receives energy may fall below that of the base/emitter resistor so that the base is effectively connected to the collector. In a second arrangement the energy responsive resistive means may be connected between the base and emitter of the transistor and its resistance increasing when receiving said energy. In a third arrangement the energy responsive element acts as a source of current (from for example a photovoltage) without drawing current from the output circuit.

The energy for producing response from the energy responsive element may take the form of light, heat, electric or magnetic flux.

By way of example a number of embodiments of the present invention are described below with reference to the accompanying drawing in which.

Figure 1:
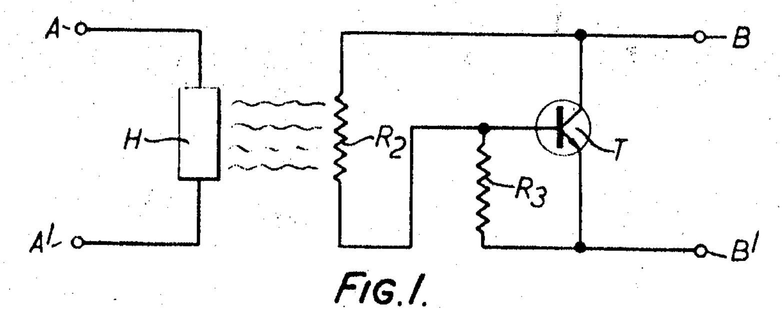
FIGURE 1 is a circuit diagram of one switching arrangement according to the invention.

Referring to FIGURE 1 of the drawing electric heating means H is connected between input terminals A and $A^1$ of the input circuit of the switching arrangement. Located in good heat-exchange relationship with the heating means H is a thermo-resistor R2 which is connected between the base and collector of a bipolar transistor T. The base and emitter of this transistor T are interconnected by a resistor R3 which has a resistance which is low compared with the resistance of the thermo-resistance R2 when the latter is unheated. Output terminals of the output circuit are indicated at B and $B^1$. In the unswitched condition of the switching arrangement when the heating means H is effectively de-energised the thermo-resistor is virtually unheated as a consequence of which the base and emitter of the transistor are virtually directly connected by reason of the relatively high resistance of the thermo-resistor R2 so that the impedance of the output circuit is very high. Consequent upon the energisation of the heating means to switch the arrangement the heat energy received by the thermo-resistor R2 causes the resistance of R2 to drop substantially so that the base is effectively connected to the collector of the transistor. In this condition of the transistor T the emitter collector current of the transistor depends upon the emitter collector voltage. The current/voltage characteristics of the output circuit of the arrangement in the switched condition is shown in FIGURE 2 of the drawing.

Figure 2:
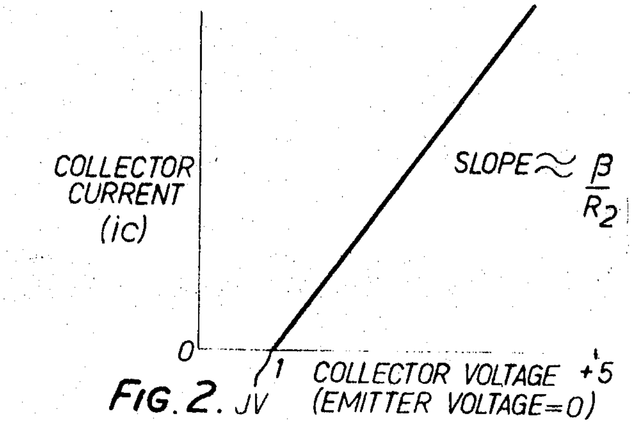
FIGURE 2 is a diagram of a current/voltage characteristic of the transistor of FIGURE 1.

Referring to FIGURE 2 it will be seen that if the collector voltage is made positive the collector current is negligibly small until the junction voltage JV of the order of +1 volt is reached and thereafter the current rises linearly, with a dynamic resistance approximately equal to the "hot" resistance of the thermo-resistor divided by the $\beta$ of the transistor T. Thus the transistor T increases the effective ON/OFF resistance ratio by a factor of $\beta$ because it reduces the ON resistance by this factor.

Figure 3:
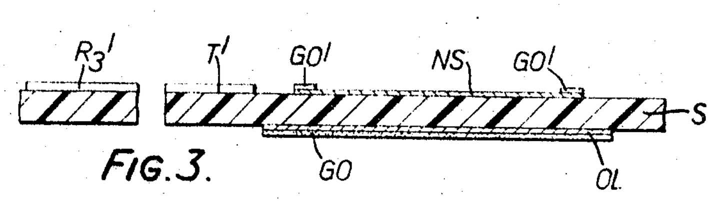
FIGURES 3 and 4 are sectional and underside views of a combined heater and thermistor for the arrangement of FIGURE 1.
Figure 4:
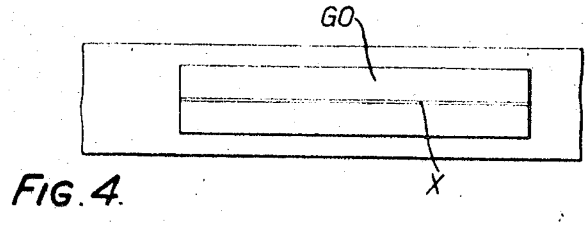

Turning now to FIGURES 3 and 4 the switching arrangement may comprise as the electric heating means, a thin Nichrome heater strip NS which may be of the order of 0.1 mm. wide and 1 cm. long, evaporated on to one side of a glass substrate S onto the other side of which has been previously evaporated a nickel film subsequently oxidised to provide a nickel oxide layer OL affording the thermo-resistor. On to this nickel oxide is evaporated gold GO with a narrow strip X (FIGURE 4) of the nickel oxide being masked, as by a fine wire, during the evaporation step so that a small gap between the gold deposit is aligned with the Nichrome strip located on the opposite side of the glass substrate. Gold $GO^1$ may also be evaporated on to the other side of the substrate S to provide connections to the ends of the Nichrome heater strip NS. In operation of the heater/ thermo-resistor current as it passes through the Nichrome heater NS causes the heater to heat up a thin strip of glass which is aligned with the uncoated nickel oxide strip X and thereby vary the conduction across the gap between the gold electrodes GO (FIGURE 2). It is extremely advantageous to bond the transistor T to the glass substrate NS as indicated at $T^1$ and this technique may be such that connections to the base, collector and emitter are made either by bonding wires to these connections or by providing evaporated connections on the substrate. The resistor R3 may also be applied to the same glass substrate by the deposition of a suitable film $R3^1$ on the substrate or it may be incorporated in a transistor chip.

Figure 5:
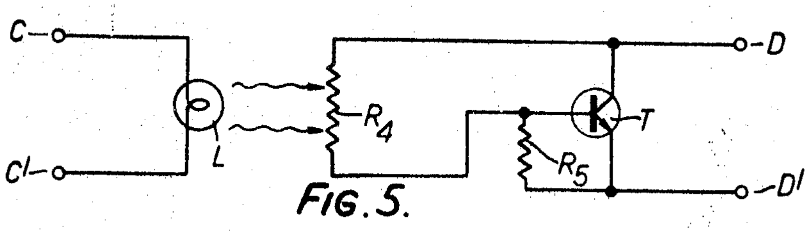
FIGURES 5 to 9 are diagrams of alternative embodiments according to the invention.

Referring to the switching arrangement in FIGURE 5, the current/voltage characteristic of the transistor T may again be understood by reference to FIGURE 2. An electrically operated light source L is connected between input terminals C and $C^1$ of the input circuit of the switching arrangement. Located in a favourable position for illumination by the light source L is a photoconductive element R4 which is connected between the base and collector of a bipolar transistor T. The base and emitter of this transistor are interconnected by a resistor R5 which has a resistance which is low compared with the resistance of the photo conductor R4 when illuminated by L. Output terminals of the output circuit are indicated at D and $D^1$. In the unswitched condition of the switching arrangement the light source is off, the photoconductor R4 is un-illuminated and the base and emitter of the transistor are virtually directly connected by reason of the relatively high resistance of the photoconductor R4 so that the impedance of the output circuit is very high. Consequent upon the energisation of the light source the light received by the photoconductor causes its resistance to drop substantially so that the base is effectively connected to the collector of the transistor. In this condition of the transistor the emitter collector current depends on the emitter collector voltage as shown in FIGURE 2 and described above.

In the arrangement of FIGURE 6 the energy means is again light energy but the responsive means comprises a photovoltaic cell or cells. Referring to the FIGURE, $P_1$ and $P_2$ are photovoltaic cells responsive to the light L. On illumination the cells give rise to a photovoltage and corresponding photocurrent I which flows in the base emitter circuit of the transistor T and is amplified by the transistor so that a current $\beta I$ flows between the terminals F, F′. In this embodiment the non-linear current voltage characteristic of the photovoltaic cell and the transistor combine to provide a system where the output resistance across F, F′ passes rapidly from a high to a low value as the illumination of $P_1$ and $P_2$ is increased past a certain level so that this form of solid state relay shows a snap action analagous to that in electromechanical relays. In a particular version of this embodiment L is a filament lamp, $P_1$ and $P_2$ are silicon photovoltaic cells and T is a silicon transistor.

Figure 7:
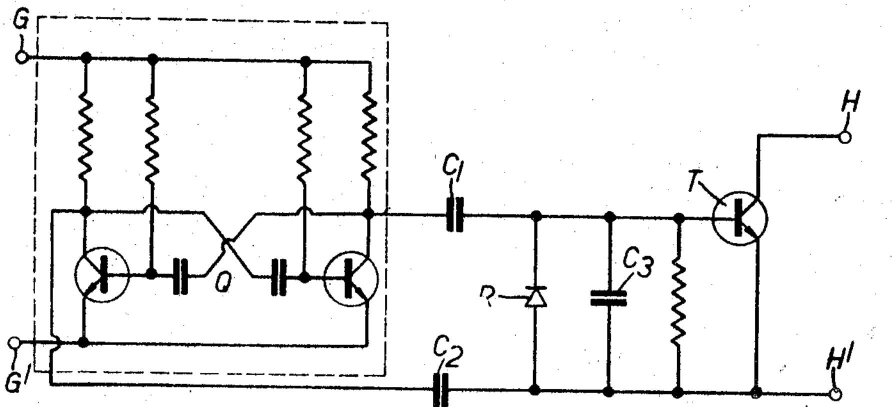

FIGURE 7 is a circuit diagram of an embodiment in which the energy is high frequency electrostatic energy. The electrical isolation between input and output circuits is provided by capacitors $C_1$ and $C_2$ which may provide substantial isolation at D.C. and low frequencies but are an adequate connection at a higher frequency called for convenience RF. It should be noted that the isolation at D.C. and frequencies up to the switching frequency is achieved without the use of a transformer. The block Q is an example of an RF oscillator in this case a multivibrator which is connected between the input terminal G and G′ of the input circuit of the switching arrangement so that oscillations begin when a voltage is applied between G and G′ and cease when it is removed. The capacitors $C_1$ and $C_2$ are connected to the output of the oscillator, and to the opposite terminals of the capacitors a rectifying and smoothing arrangement is connected, comprising the combination of the rectifier R and the capacitor $C_3$. This combination responds to the energy derived through the blocking capacitors $C_1$ and $C_2$ which serve to provide the requisite output impedance. By this means a direct current is applied to the base of the transistor T which is amplified so that the output terminals H, H′ of the arrangement are switched into the ON conditions. In preferred forms of this arrangement the oscillator Q is formed largely or wholly on a single silicon chip and the capacitors are formed on portions of a single high dielectric constant ceramic wafer.

Figure 6:
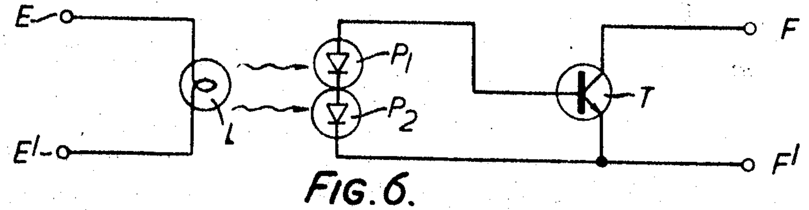
Figure 8:
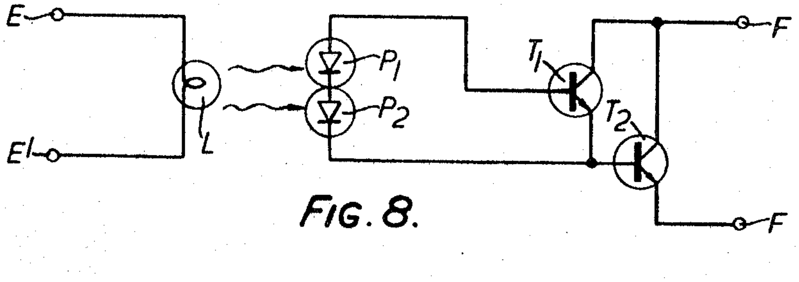
Figure 9:
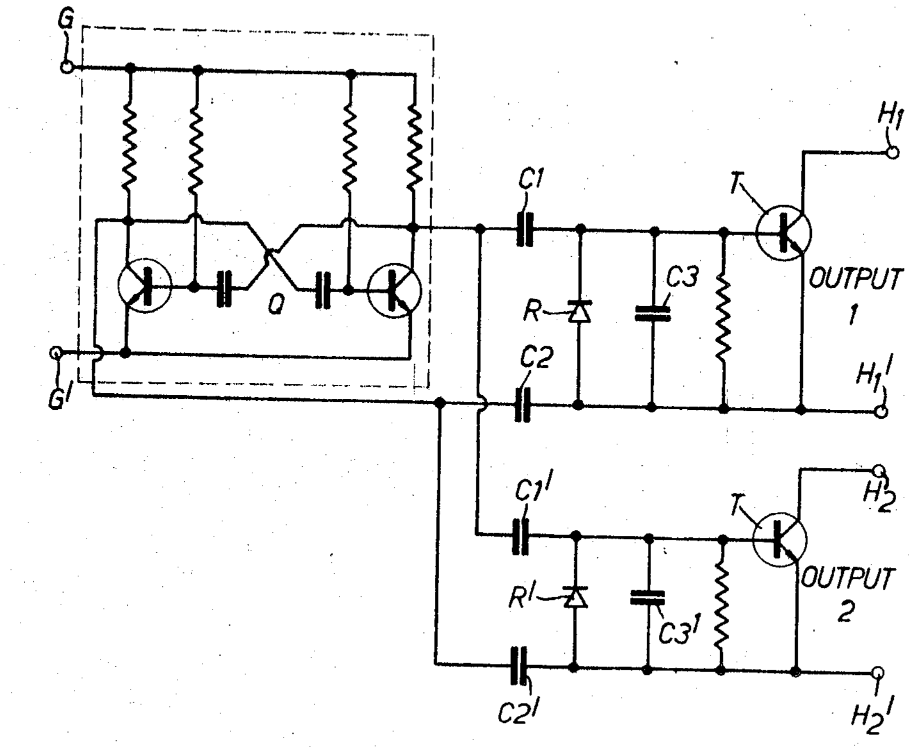

Although the invention has been described with reference to a conventional bipolar transistor it is to be understood that the invention has application to switching arrangements employing other solid-state amplifying devices including thin-film triodes, so-called unipolar transistors and field effect transistors or to combinations of the above either as discrete devices or in a single integrated device. An example of an embodiment of the invention containing a more complex amplifying device is illustrated in FIGURE 8 whose operation is largely analogous to FIGURE 6. The single transistor T of FIGURE 6 is replaced by the combination $T_1$ and $T_2$ which is so arranged that the current available at the output terminals F, F′ is $\beta 1$, $\beta 2$ times greater than that applied to the input of the transistor by the photocells $P_1$ and $P_2$, where $\beta 1$, $\beta 2$ are the current gains of the two transistors. In a preferred form of this embodiment the two transistors $T_1$ and $T_2$ are fabricated in a single chip of silicon, which may if desired contain the photocells $P_1$ and $P_2$.

By an obvious extension of the above invention multiple contact forms of the above solid state relays may be formed by allowing the energy source to actuate several different responsive elements connected to different amplifying elements and output terminals. An example of a two-contact solid state relay using the circuit of FIGURE 7 is shown in FIGURE 8.

In the case of magnetic coupling between the input and output circuits of a switching arrangement according to the invention the capacitors C1 and C2 of FIGURE 7, could be replaced by a solid state transformer which decouples as far as D.C. is concerned.

What we claim is:

1. An oscillator controlled switching circuit comprising an oscillator input circuit; a pair of capacitors; and an output circuit including a solid-state amplifying device having a controlled circuit which includes energy responsive means responsive to the energy received from the oscillator to bring about variation of its electrical condition for switching of said amplifying device, said oscillator input circuit being connected to said output circuit along two paths each including one of said pair of capacitors, said energy responsive means including a rectifier, said paths alternately providing return paths for current flow between the input and output circuits during the operation of said oscillator input circuit.

2. An oscillator controlled switching circuit as claimed in claim 1, in which said energy responsive means comprises said rectifier and a capacitor in parallel connection therewith.

3. An oscillator controlled switching circuit as claimed in claim 2, including a second pair of capacitors and a second output circuit including a second solid-state amplifying device having a second control circuit which includes a second parallel-connected rectifier and capacitor adapted to vary its electrical condition in response to the energy received from said oscillator input circuit for switching said second amplifying device, said oscillator input circuit being connected to said second output circuit along two further paths each including one of said second pair of capacitors.

4. An oscillator controlled switching circuit as claimed in any one of claims 1, 2 and 3, in which said first and second amplifying devices each comprise a transistor having the respective energy responsive means connected in its base-emitter circuit.

5. An oscillator controlled switching circuit as claimed in any one of claims 1, 2 and 3, constructed as an integrated circuit.

References Cited

UNITED STATES PATENTS

| | | | |
|---|---|---|---|
| 3,054,978 | 9/1962 | Schmidlin et al. ---- | 307—310 X |
| 3,287,619 | 11/1966 | Burson ---------- | 307—315 X |
| 3,287,975 | 11/1966 | Mason et al. ------ | 307—310 X |
| 3,292,010 | 12/1966 | Brown et al. ------ | 307—247 X |
| 3,293,636 | 12/1966 | Dunne ------------ | 307—235 X |
| 3,321,631 | 5/1967 | Biard et al. -------- | 307—311 X |
| 3,325,680 | 6/1967 | Amacher -------- | 307—311 X |

DONALD D. FORRER, Primary Examiner

U.S. Cl. X.R.

307—247, 253, 310, 311, 315